US010672875B2

(12) United States Patent
Rupp et al.

(10) Patent No.: US 10,672,875 B2
(45) Date of Patent: Jun. 2, 2020

(54) SILICON CARBIDE SEMICONDUCTOR DEVICE AND A METHOD FOR FORMING A SILICON CARBIDE SEMICONDUCTOR DEVICE

(71) Applicant: Infineon Technologies AG, Neubiberg (DE)

(72) Inventors: Roland Rupp, Lauf (DE); Guenther Ruhl, Regensburg (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/224,225

(22) Filed: Dec. 18, 2018

(65) Prior Publication Data
US 2019/0123148 A1    Apr. 25, 2019

Related U.S. Application Data

(63) Continuation of application No. 15/210,106, filed on Jul. 14, 2016, now Pat. No. 10,164,019.

(30) Foreign Application Priority Data

Jul. 15, 2015  (DE) .................. 10 2015 111 453

(51) Int. Cl.
*H01L 29/08*    (2006.01)
*H01L 29/16*    (2006.01)
(Continued)

(52) U.S. Cl.
CPC ...... *H01L 29/1608* (2013.01); *H01L 21/0262* (2013.01); *H01L 21/02444* (2013.01);
(Continued)

(58) Field of Classification Search
CPC .......... H01L 29/1608; H01L 21/02441; H01L 21/02529; H01L 21/0262; H01L 21/26506; H01L 21/324
See application file for complete search history.

(56) References Cited

U.S. PATENT DOCUMENTS

2012/0156479 A1    6/2012  Nakamura et al.
2012/0261673 A1   10/2012  Schulze et al.
(Continued)

FOREIGN PATENT DOCUMENTS

DE    112012001742 T5    1/2014
DE    112012000467 B4    1/2015

OTHER PUBLICATIONS

Bonaccorso, Francesco, et al., "Production and Processing of Graphene and 2d Crystals", Materials Today, vol. 15, No. 12, Dec. 2012, pp. 564-589.
(Continued)

*Primary Examiner* — Elias Ullah
(74) *Attorney, Agent, or Firm* — Murphy, Bilak & Homiller, PLLC

(57) ABSTRACT

A method for forming a silicon carbide semiconductor device includes forming at least one graphene layer on a surface of a semiconductor substrate and forming a silicon carbide layer of the silicon carbide semiconductor device on the at least one graphene layer. At least one of forming the silicon carbide layer and forming the at least one graphene layer includes: heating the semiconductor substrate an inert gas atmosphere until a predefined temperature is reached.

20 Claims, 5 Drawing Sheets

(51) Int. Cl.
- *H01L 29/36* (2006.01)
- *H01L 29/417* (2006.01)
- *H01L 21/02* (2006.01)
- *H01L 21/265* (2006.01)
- *H01L 21/324* (2006.01)
- *H01L 29/41* (2006.01)
- *H01L 29/78* (2006.01)

(52) U.S. Cl.
CPC .. *H01L 21/02494* (2013.01); *H01L 21/02529* (2013.01); *H01L 21/02658* (2013.01); *H01L 21/02664* (2013.01); *H01L 21/26506* (2013.01); *H01L 21/324* (2013.01); *H01L 29/083* (2013.01); *H01L 29/0804* (2013.01); *H01L 29/0821* (2013.01); *H01L 29/36* (2013.01); *H01L 29/41725* (2013.01); *H01L 29/1606* (2013.01); *H01L 29/413* (2013.01); *H01L 29/7802* (2013.01)

(56) References Cited

U.S. PATENT DOCUMENTS

| | | |
|---|---|---|
| 2013/0248823 A1 | 9/2013 | Bol et al. |
| 2015/0137074 A1 | 5/2015 | Lee et al. |
| 2016/0190446 A1 | 6/2016 | Schulze et al. |

OTHER PUBLICATIONS

Emtsev, Konstantin, et al., "Towards Wafer-Size Graphene Layers by Atmospheric Pressure Graphitization of Silicon Carbide", Nature Materials: Letters, vol. 8, published online Feb. 8, 2009, www.nature.com/naturematerials, Mar. 2009, pp. 203-207.

Kedzierski, Jakub, et al., "Epitaxial Graphene Transistors in SiC Substrates", IEEE Transactions on Electron Devices, vol. 55, No. 8, Aug. 2008, pp. 2078-2085.

Kim, Jeehwan, et al., "Principle of Direct van der Waals Epitaxy of Single-Crystalline Films on Epitaxial Graphene", Nature Communications 5, Article No. 4836, Retrieved Jun. 19, 2015, http://wvw.nature.com/ncomms/2014/140911/ncomms5836/fijll/ncomms5836.html, Sep. 11, 2014, pp. 1-3.

Luxmi, Shu Nie, et al., "Temperature Dependence of Epitaxial Graphene Formation on SiC(0001)", Journal of Electronic Materials, vol. 28, No. 6, Special Issue Paper, 2009, pp. 718-724.

Riedl, C., et al., "Structural and Electronic Properties of Epitaxial Graphene on SiC(0001): a review of growth, characterization, transfer doping and hydrogen intercalation", Journal of Applied Physics D: Applied Physics, IOP Publishing, Sep. 2, 2010, pp. 1-17.

Seyller, TH., et al., "Epitaxial Graphene, a New Material", Physica Status Solidi, vol. 245, Issue 7, Jul. 2008, pp. 1-10.

"Van der Waals epitaxy of GaN and blue LEDs", Article Retrieved Jan. 30, 2015, http://www.semiconductor-today.com/news_items/2014/OCT/IBM_021014.shtml, Oct. 2, 2014, pp. 1-4.

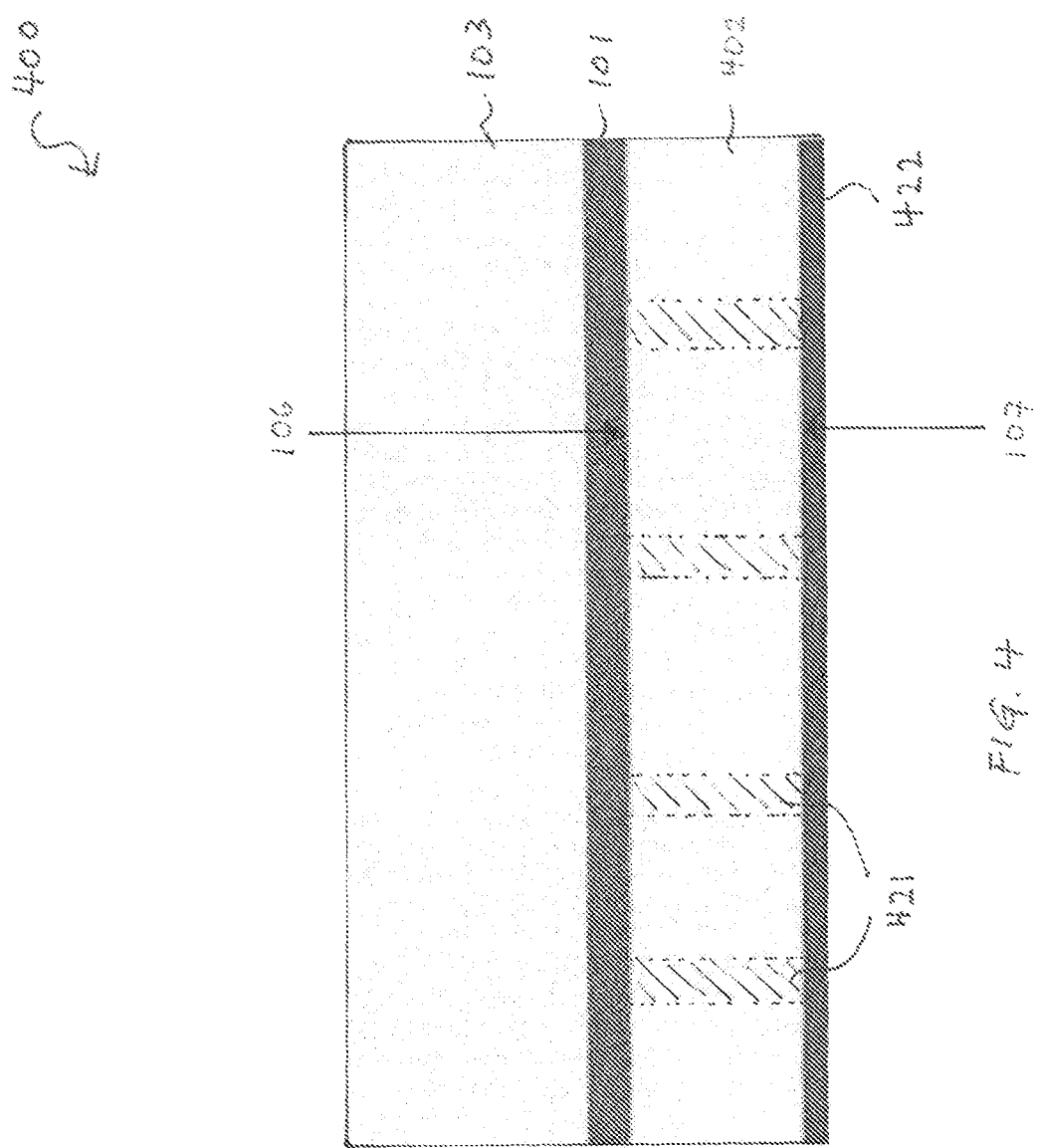

SILICON CARBIDE SEMICONDUCTOR DEVICE AND A METHOD FOR FORMING A SILICON CARBIDE SEMICONDUCTOR DEVICE

TECHNICAL FIELD

Embodiments relate to semiconductor device structures, and in particular to a semiconductor device and a method for forming a semiconductor device.

BACKGROUND

Semiconductor components may suffer from excess heating or hot spots, which may be caused by current surges during power up or shut down processes or short circuiting of the semiconductor components. Structures or layers which may be used to reduce hot spots may be difficult or expensive to produce. Furthermore, such layers or structures may suffer from high surface roughness, for example. Furthermore, the forming of structures for reducing excessing heating or hot spots may be challenging, for example.

It is a demand to provide a concept for improving a thermal conductivity or electrical conductivity of semiconductor device structures.

SUMMARY

Some embodiments relate to a method for forming a semiconductor device. The method comprises forming at least one graphene layer on a surface of a semiconductor substrate. The method further comprises forming a silicon carbide layer on the at least one graphene layer.

Some embodiments relate to a semiconductor device comprising at least one graphene layer arranged between a semiconductor substrate and a silicon carbide layer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Some embodiments of apparatuses and/or methods will be described in the following by way of example only, and with reference to the accompanying figures, in which

FIG. 1B shows a schematic illustration of a method for forming a semiconductor device.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
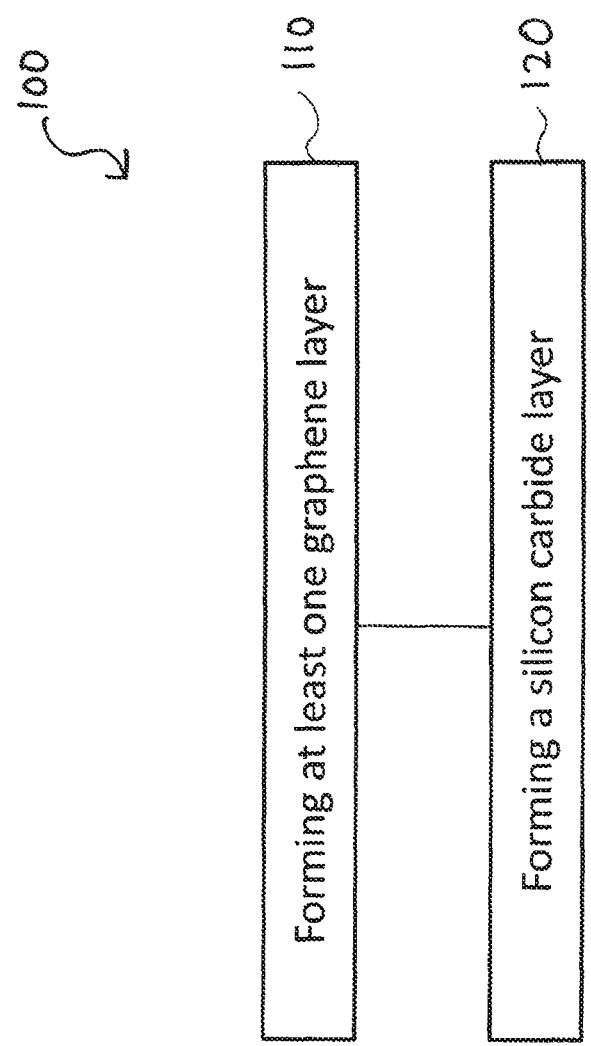
FIG. 1A shows a flow chart of a method for forming a semiconductor device.

FIG. 1 shows a flow chart of a method 100 for forming a semiconductor device according to an embodiment.

The method 100 comprises forming 110 at least one graphene layer on a surface of a semiconductor substrate.

The method 100 further comprises forming 120 a silicon carbide layer on the at least one graphene layer.

Due to the forming 120 of the silicon carbide (SiC) layer on the at least one graphene layer, a reliable and low cost method for cleaving or separating a semiconductor substrate from a silicon carbide layer may be provided. Furthermore, the at least one graphene layer may improve current conduction or heat spreading from the silicon carbide layer or devices formed in the silicon carbide layer, for example.

Forming 110 the at least one graphene layer on the surface of the semiconductor substrate may include forming a single (e.g. one) graphene layer on the semiconductor substrate, for example. Alternatively, additionally or optionally, forming 110 the at least one graphene layer on the surface of the semiconductor substrate may include forming a multi-layer graphene structure comprising less than 10 atomic layers of graphene (or e.g. between 1 atomic layer and 10 atomic layers of graphene) on the surface of the semiconductor substrate, for example. Each graphene layer formed may be a single monolayer of carbon, which may include or may be a two-dimensional sheet of sp2-bonded carbon (C) atoms arranged in a honeycomb lattice, for example.

The at least one graphene layer or multi-layer graphene structure may be formed 110 directly on the surface of the semiconductor substrate (without layer of another material in between). In this example, the at least one graphene layer or multi-layer graphene structure is in contact with the semiconductor substrate, for example.

The at least one graphene layer may be formed by applying a temper process (e.g. a temperature or heating process) to the semiconductor substrate (e.g. a SiC-based substrate). For example, the at least one graphene layer may be formed on at least one silicon carbide layer of the semiconductor substrate or on a silicon carbide (SiC) substrate by heating (e.g. tempering) the semiconductor substrate to a temperature of at least 900° C. in a vacuum or in an inert atmosphere. For example, an oven temperature of between 950° C. and 1600° C. may be selected. The at least one graphene layer formed may be a supporting or padding graphene layer (between the SiC layer and the semiconductor substrate), for example. The at least one graphene layer may be formed by a solid state graphitization due to a desorption (or evaporation) of silicon (from the SiC based substrate) and the formation of excess carbon on the surface of the semiconductor substrate, for example.

Forming 110 the at least one graphene layer may include forming a single graphene layer on a silicon face (Si-face) (e.g. a silicon atom-terminated surface) of the at least one silicon carbide substrate layer of the semiconductor substrate, for example. Alternatively, or optionally, forming the at least one graphene layer may include forming at least one graphene layers (e.g. one graphene layer, or e.g. two or more graphene layers) on a carbon face (C-face) (e.g. a carbon atom-terminated surface) of the at least one silicon carbide substrate layer of the semiconductor substrate.

The method 100 may further include forming a plurality of openings in the at least one graphene layer before forming the silicon carbide layer on the at least one graphene layer. The plurality of openings may be circular shaped (or e.g. octagonal shaped, or e.g. strip shaped), for example. A maximal lateral dimension of each opening of the plurality of openings may lie between 10 nm and 10 μm (or e.g. between 1 μm and 10 μm, or e.g. between 2 μm and 8 μm), for example. The maximal lateral dimension of an opening may be a largest distance between a first region of the opening and a second region of the opening measured in a direction parallel to a main (or lateral) surface of the semiconductor substrate, for example. Optionally, the lateral dimensions of the plurality of openings may be controlled to make a later separation of the semiconductor substrate from the silicon carbide layer easier. For example, the lateral dimensions may be prevented from being too large (e.g. larger than 10 μm), which may make separating the semiconductor substrate from the silicon carbide layer more challenging, for example.

The minimal distance between neighboring openings of the plurality of openings may lie between 2 μm and 30 μm (or e.g. between 4 μm and 15 μm), for example. The minimal distance between the neighboring openings may be a smallest distance between the neighboring openings in a lateral direction substantially parallel to a main (or lateral) surface of the semiconductor substrate, for example.

The plurality of openings located in the at least one graphene layer may expose portions of the semiconductor substrate on which the at least one graphene layer is formed, for example. For example, plurality of openings may expose a silicon carbide substrate layer or silicon carbide portion of the semiconductor substrate. The silicon carbide layer may be grown epitaxially in the regions of the semiconductor substrate exposed by the plurality of openings in the at least one graphene layer. Thus, good information about the crystalline structure of the underlying silicon carbide-based semiconductor substrate may be used for the forming of the silicon carbide layer on the at least one graphene layer. The crystalline structure of the underlying silicon carbide-based semiconductor substrate may be formed (or transferred or repeated) in the silicon carbide layer even as the silicon carbide layer grows laterally (e.g. in parallel to the surface of the semiconductor substrate) onto the graphene layer from the plurality of openings in the graphene layer, for example.

Forming 120 the silicon carbide layer on the at least one graphene layer (and in the plurality of openings in the at least one graphene layer) may include heating the semiconductor substrate in an inert atmosphere (e.g. an argon Ar atmosphere) until a predefined temperature (e.g. of at least 600° C.) is reached. The heating of the semiconductor substrate in the argon atmosphere may be carried out in a single stage temperature ramping process or two-stage (or multi-stage) temperature ramping process, for example.

The silicon carbide layer may be formed 120 directly on the at least one graphene layer or multi-layer graphene structure (without layer of another material in between). In this example, the silicon carbide layer is in contact with the at least one graphene layer or multi-layer graphene structure, for example.

When or after the predefined temperature is reached, the concentration (or flow) or argon gas may be reduced, for example. Growth of the (epitaxial) silicon carbide layer may be started when or after the predefined temperature has been reached (e.g. when a temperature of the semiconductor substrate reaches the predefined temperature). Forming the silicon carbide layer may include growing a first (or seeding) portion of the silicon carbide layer of by atomic layer deposition (ALD), molecular beam epitaxy (MBE), or by chemical vapor deposition (CVD) with a precursor at a first (gaseous) concentration. The precursor may be a mixture of silane gas and propane gas (or e.g. a mixture of silane and methane gas, or e.g. a mixture of Si—H and/or C—H chemical compositions), for example. After the first portion of the silicon carbide layer is formed or seeded on the semiconductor substrate, the forming of the silicon carbide layer may be continued at a faster (or full) growth rate, for example. The first portion of the silicon carbide layer (e.g. at least the seed silicon carbide layer) may be formed at a slower growth rate or at a lower gas concentration so that the at least one graphene layer is not damaged by process gases, for example. To reach the faster or full growth rate once the at least one graphene layer is covered by the first portion of the silicon carbide layer, hydrogen gas may be introduced into the mixture of silane gas and propane gas, and furthermore the concentration or flow of silane gas and propane gas may be increased, for example. For example, the growth of the silicon carbide layer may be continued or carried out by atomic layer deposition (ALD), molecular beam epitaxy (MBE), or by chemical vapor deposition with a mixture of the silane gas, the propane gas and the hydrogen gas at a second (gaseous) concentration higher than the first (gaseous) concentration.

FIG. 1B shows a schematic illustration 150 of the at least one graphene layer 101 formed on a surface of the semiconductor substrate 102, and the (epitaxial) silicon carbide layer 103 formed on the at least one graphene layer 101 (e.g. before removing the semiconductor substrate 102 from the silicon carbide layer 103). The grown silicon carbide layer 103 may have a minimal thickness of less than 10 µm, or less than 5 µm, for example. For example, the minimum thickness of the silicon carbide layer 103 may be the smallest thickness of the silicon carbide layer 103 measured in a vertical direction, substantially perpendicular or orthogonal to the main surface of the semiconductor substrate 102, for example.

The method 100 may further include (optionally) removing the semiconductor substrate 102 from the silicon carbide layer 103 after forming the silicon carbide layer 103 on the at least one graphene layer 101. The method may include forming a stress-inducing layer on the silicon carbide layer 103 for inducing stress between the silicon carbide layer 103 and the semiconductor substrate 102 for removing the semiconductor substrate 102 from the silicon carbide layer 103. The stress-inducing layer may be a nickel layer, a copper layer or an epoxy layer, for example. Additionally, optionally or alternatively, the method may include providing a stress-inducing heating (or cooling) process (e.g. heating the semiconductor substrate 102 to a temperature of at least 90° C.) for inducing stress between the silicon carbide layer 103 and the semiconductor substrate 102 for removing the semiconductor substrate 102 from the silicon carbide layer 103, for example.

The semiconductor substrate 102 may be removed from the silicon carbide layer 103 by attaching an adhesive tape to a surface 104 (e.g. an exposed surface) of the silicon carbide layer 103 and stripping the silicon carbide layer 103 from the semiconductor substrate 102. Alternatively, the semiconductor substrate 102 may be removed (or separated) from the silicon carbide layer 103 by an implantation of oxygen or hydrogen atoms in the regions of the at least one graphene layer 101. The implanting of the oxygen or hydrogen atoms may be carried out at room temperature followed by an annealing process (e.g. to at least 600° C.). Alternatively, the oxygen or hydrogen atoms may be implanted at a temperature of at least 600° C., for example. The heating process (or the elevated temperature) may transform the carbon atoms of the at least one graphene layer 101 into carbon monoxide (e.g. CO) or carbon dioxide gas ($CO_2$), for example. An implantations dose of between $1 \times 10^{14}$ atoms per cm$^2$ and $2 \times 10^{16}$ atoms per cm$^2$ (or e.g. between $1 \times 10^{15}$ atoms per cm$^2$ and $1 \times 10^{16}$ atoms per cm$^2$) may be used, for example.

After removing the semiconductor substrate 102 from the silicon carbide layer 103, at least part of the at least one graphene layer 101 may still remain at a surface of the epitaxial silicon carbide layer 103. At least one graphene layer 101 may remain (e.g. attached to) the silicon carbide layer 103 if multiple (e.g. two or e.g. a plurality of) graphene layers 103 were formed between the silicon carbide layer 103 and the semiconductor substrate 102, for example. Additionally, or optionally, at least one graphene layer 103 of the plurality of graphene layers 103 may remain on the silicon carbide layer 103 and at least one (further) graphene layer 103 of the plurality of graphene layers 103 may remain on the semiconductor substrate 102, for example.

The method 100 may further include arranging the silicon carbide layer 103 on a carrier substrate after removing the semiconductor substrate 102 from the silicon carbide layer 103. The silicon carbide layer 103 (and optionally the at least one remaining graphene layer 101) may be arranged on the carrier substrate such that the at least one graphene layer 101 may be located between the silicon carbide layer 103 and the carrier substrate.

Alternatively, or optionally, the silicon carbide layer 103 may be arranged on the carrier substrate before removing the semiconductor substrate 102 from the silicon carbide layer 103. For example, a (second) surface 104 of the silicon carbide layer 103 (opposite to the first surface 105 of the silicon carbide layer 103 at which the at least one graphene layer 101 is located) may be arranged on the carrier substrate before removing the semiconductor substrate 102 from the silicon carbide layer 103. The silicon carbide layer 103 may be arranged between the carrier substrate and the at least one graphene layer 101, for example.

Additionally, or optionally, the method 100 may further include removing parasitic or unwanted graphene layers 101 from the silicon carbide layer 103. For example, the method may include removing the at least one graphene layer 101 remaining on the silicon carbide layer 103. The at least one graphene layer 101 may be removed from the silicon carbide layer 103 by an exposure to an oxygen atmosphere at a temperature of at least 600° C., or an oxygen plasma which may transform the carbon atoms of the at least one graphene layer 101 into carbon monoxide (e.g. CO) or carbon dioxide gas ($CO_2$), for example.

Alternatively, or optionally, the at least one graphene layer 101 may be left to remain on or (directly) adjacent to the silicon carbide layer 103. The at least one graphene layer 101 remaining on the separated silicon carbide layer 103 after the separation process may form or may provide an electrically conductive and/or thermally conductive contact structure, for example. For example, the at least one graphene layer 101 may be a back side contact or provide an electrical connection and/or thermal connection to a back side metallization contact. The at least one graphene layer 101 may exhibit current spreading and/or heat spreading properties as a back side contact, for example.

The method 100 may further include forming at least one metallization layer (or metallization layer stacks) or at least one barrier layer (or barrier layer stacks) deposited on (or adjacent to or directly adjacent to) the at least one graphene layer. The at least one metallization layer may include layers comprising aluminum (Al), titanium (Ti), copper (Cu), molybdenum (Mo) or combinations or alloys of these materials, for example. The at least one barrier layer may include layers comprising titanium-tungsten (TiW), titanium nitride (TiN), tantalum (Ta), molybdenum nitride (MoN), or tantalum nitride (TaN), for example.

For example, the at least one metallization layer or the at least one barrier layer may be formed on a surface of the carrier substrate before arranging the silicon carbide layer 103 on the carrier substrate.

Instead of removing the semiconductor substrate 102 from the silicon carbide layer 103, the method 100 may include leaving the silicon carbide layer 103 (and the at least one graphene layer 101) to remain on the semiconductor substrate 102. The at least one graphene layer 101 formed between the silicon carbide layer 103 and the semiconductor substrate 102 may provide a buried electrode for a semiconductor device structure formed (or to be formed) in the silicon carbide layer 103, for example.

The semiconductor substrate 102 on which the at least one graphene layer 101 is formed may be a silicon-carbide (SiC) based substrate. Optionally, the semiconductor substrate 102 may be a pure SiC-substrate. Optionally or alternatively, the semiconductor substrate 102 may include at least one silicon carbide substrate layer deposited or located on a carrier substrate (e.g. a silicon substrate or a carbon substrate), for example. Optionally or alternatively, the semiconductor substrate 102 may include a polysilicon carbide (poly-SiC) substrate, for example. Optionally or alternatively, the semiconductor substrate 102 may include a silicon carbide substrate layer deposited on a carbon carrier substrate, for example.

The method 100 may further include forming a plurality of electrically conductive structures in the semiconductor substrate 102. The plurality of electrically conductive structures may be formed by etching a plurality of trenches extending from a surface 107 (e.g. the back side surface) of the semiconductor substrate 102 towards (or to) an opposite surface 106 (e.g. the front side surface) of the semiconductor substrate 102, and depositing electrically conductive material (e.g. metals and/or graphene) in the plurality of trenches. For example, graphene trench layers may be formed on sidewalls of the plurality of trenches. Additionally, or optionally, one or more additional metallization layers or a metallization layer stack or another electrically highly conductive layer (like e.g. doped or undoped polysilicon) may be formed on the graphene trench layers formed on the sidewalls of the plurality of trenches, for example. The plurality of electrically conductive structures may be formed after (or before) forming the at least one graphene layer 101 on the (front side) surface 106 of the semiconductor substrate 102, for example. The plurality of electrically conductive structures may provide an electrically conductive path (and/or thermally conductive path) between the at least one graphene layer 101 and a back side metallization electrode formed at the opposite (back side) surface 107 of the semiconductor device, for example. The plurality of electrically conductive structures (e.g. the trenches) may end at (or be directly contacted to) the at least one graphene layer 101 acting as a self-adjusted etch stop, for example. Alternatively, or optionally, the plurality of electrically conductive structures (e.g. the trenches) may end before the at least one graphene layer 101 is reached, for example.

A maximal lateral dimension of each electrically conductive structure of the plurality of electrically conductive structures may lie between 50 nm and 5000 nm (or e.g. between 100 nm and 1000 nm), for example. The maximal lateral dimension of the electrically conductive structure may be a largest distance between sidewalls of the electrically conductive structure, in a direction substantially parallel to a lateral surface of the semiconductor substrate 102, for example. A maximal spacing between neighboring electrically conductive structures may lie between 50 nm and 500 nm (or e.g. between 100 nm and 300 nm), for example. The maximal spacing between neighboring electrically conductive structures may be a largest distance between sidewalls of neighboring electrically conductive structures, in a direction substantially parallel to a lateral surface of the semiconductor substrate 102, for example.

Additionally, or alternatively to the forming of the plurality of the electrically conductive structures, the method 100 may further include doping the semiconductor substrate 102 to a doping concentration of between $1 \times 10^{18}$ doping atoms per $cm^3$ and $1 \times 10^{20}$ doping atoms per $cm^3$. The doping of the semiconductor substrate 102 may be as high as possible, to minimize the bulk resistance or path resistance between an electrode (e.g. the electrically conductive contact layer) on the back side of the semiconductor substrate 102 and the buried graphene layer 101. The doping may be carried out by a highly n-type donor doping (e.g. with nitrogen dopants) of at least $1 \times 10^{18}$ doping atoms per $cm^3$, for example. Alternatively, the doping may be carried out by a highly p-type acceptor doping (e.g. with aluminum dopants) of at least $1 \times 10^{18}$ doping atoms per $cm^3$, for example.

Optionally, the method 100 may include forming a contact implantation or carrying out a carbon producing laser process at the back side surface 107 of the semiconductor substrate to reduce a contact resistance between the semiconductor substrate 102 and the back side metallization electrode, for example.

The method 100 may further include forming the at least one metallization layer or the at least one barrier layer at a surface of the semiconductor 102. The at least one metallization layer or the at least one barrier layer may be formed on the semiconductor substrate 102 after (or before) forming the at least one graphene layer 101 and the silicon carbide layer 103 on the semiconductor substrate 102, for example. For example, the method 100 may include forming at least one electrically conductive contact layer at the back side surface 107 of the semiconductor substrate 102, for example.

The method 100 may further include forming a semiconductor device structure (e.g. a silicon carbide component) comprising at least one doping region in the silicon carbide layer 103. The method may include forming the semiconductor device structure in the silicon carbide layer 103 before removing the semiconductor substrate 102 from the silicon carbide layer 103, or while the silicon carbide layer 103 is located on the semiconductor substrate 102, for example. Alternatively, the method may include forming the semiconductor device structure in the silicon carbide layer 103 after arranging the silicon carbide layer 103 on the carrier substrate, for example.

The at least one doping region of the semiconductor device structure may include at least part of a metal oxide semiconductor field effect transistor (MOSFET) structure, an insulated gate bipolar junction transistor (IGBT) structure, a thyristor structure or a diode structure, for example. For example, optionally, the at least one doping region of the semiconductor device structure may be part of a source/drain region of a MOSFET structure, or a collector/emitter region of an IGBT structure, for example. Alternatively, or optionally, the at least one doping region of the semiconductor device structure may be an anode region or cathode region of a diode structure, or an anode region or cathode region of a thyristor structure, for example.

The at least one doping region of the semiconductor device structure formed in the silicon carbide layer 103 may be located adjacently to the at least one graphene layer 101. For example, the at least one doping region may be in electrical connection and/or in thermal connection with the at least one graphene layer 101.

The method 100 may provide a concept for a reliable and low cost method to split off, to cleave or to separate a semiconductor substrate from a silicon carbide layer, for example. The method 100 may avoid removing or separating thin layers from a substrate using high implantation doses of hydrogen which may lead to high processes costs (e.g. using a smart cut method which may cleave definitive layers during a wafer bonding processes), for example. The method 100 may avoid methods (e.g. a cold split method) which may lead to high surface roughness in the cleaved layers, for example.

The method 100 may provide a concept for forming at least one graphene layer by an appropriate temper process on a silicon carbide substrate, and depositing or growing an epitaxial silicon carbide layer on the at least one graphene layer, for example. Depending on the process conditions, an oven temperature of between 950° C. and 1600° C. may be selected, for example. The graphene layer may be formed as a supporting or padding graphene layer (e.g. grown on the Si-terminated side), and may improve the separation of silicon carbide from a substrate through a heating processes with hydrogen which terminates the silicon carbide surface, for example.

A single graphene layer 101 may be formed on a silicon terminated side of the silicon carbide substrate layer of the semiconductor substrate 102. Additionally, or alternatively, a multi layered graphene layer 101 (e.g. 2 layer graphene) may be grown on the carbon-terminated side of the silicon carbide substrate layer of the semiconductor substrate 102. As the at least one graphene layer 101 are held together only by weak van der Waals forces, these may function as a breaking point for the subsequent separation of the semiconductor substrate 102 from the grown silicon carbide layer 103.

During the seeding of the silicon carbide layer 103 on the at least one graphene layer 101, damage of the graphene layers 101 through process gases may be minimized. A low supersaturation in a CVD process with Ar carrier gas (e.g. using silane and/or propane precursors) may be used to minimize damage to the at least one graphene layer 101 during growth of the silicon carbide layer 103. Atomic laser deposition (ALD) of the first atom layer (of silicon carbide) may be carried out until the at least one graphene layer 101 is safely covered to minimize damage to the at least one graphene layer 101 during the growth of the silicon carbide layer 103. Alternatively, or additionally, molecular beam epitaxy (MBE) may be used for seeding and/or growing the silicon carbide layer 103 to minimize damage to the at least one graphene layer 101 during the growth of the silicon carbide layer 103.

The semiconductor substrate 102 may be a pure silicon carbide substrate or may include a silicon carbide layer deposited on a silicon substrate (for subsequent process temperatures which lie under the melting point of silicon). Other wafers (e.g. poly-SiC substrates or carbon carrier substrates) may be used, for example.

In pure silicon carbide substrates, the epitaxial growth of the silicon carbide layer 103 may be carried out through known variations in the height or level created by the local openings in the at least one graphene layer 101. To optimize the quality of the silicon carbide layer 103 formed on the graphene layer, the at least one graphene layer 101 may optionally be structured, so that through the "epitaxial lateral overgrowth" of the silicon carbide layer 103, good information about the crystal structure (of the underlying silicon carbide substrate 102 or silicon carbide substrate layer) may be obtained.

The later separation of the silicon carbide layer 103 formed on the graphene layer 101 may be carried out through the introduction of a stress inducing layer and a subsequent stripping of the layer stack (e.g. the silicon carbide and/or the graphene layer). Temperature induced stress may also be used. The stress induced layer may later be removed after the layer packet is bonded onto a carrier substrate, for example.

The carrier substrate may be a carbon based carrier with conducting intermediate layers deposited on its surface. Subsequently, through an oxygen ($O_2$) plasma, or a temper process in an oxygen atmosphere under high temperature (e.g. greater than 600° C.), may be introduced to remove parasitic and adhesive graphene or carbon, for example.

Alternatively, additionally or optionally, thin epitaxial grown silicon carbide layers (e.g. having a thickness of less than 5 µm) may be separated from the semiconductor substrate by an implantation of oxygen in the area of the graphene layer, wherein carbon atoms of the graphene layer may be transformed to a CO based gas e.g. $CO_2$ at a subsequent temper process at high temperatures (e.g. greater than 600° C.). An implantations dose of between $1\times10^{15}$ and $1\times10^{16}$ atoms per $cm^2$ may be used, for example.

Optionally, the graphene layer, which may remain on the separated silicon carbide layer after the separation process (e.g. by using multi graphene layers), may be used to provide a good back side contact (e.g. as a current spreader or a heat spreader) to n-doped SiC due to a low energy barrier, for example.

The method 100 may provide a concept for forming a buried electrode in silicon carbide based substrates, which may improve the electrical and thermal properties of the semiconductor component. The components implemented in the epitaxial silicon carbide layer may include SiC-MOSFETs, SiC-based compensation components, SiC-IGBTs, SiC-thyristors and/or SiC diodes, for example. The method 100 may provide a concept for forming at least one graphene layer through an appropriate temper process on a silicon carbide substrate, and depositing or growing an epitaxial silicon carbide layer on the at least one graphene layer so that the at least one graphene layer functions as a buried electrode. Depending on process conditions, an oven temperature of between 950° C. and 1600° C. may be selected, for example.

Figure 2:
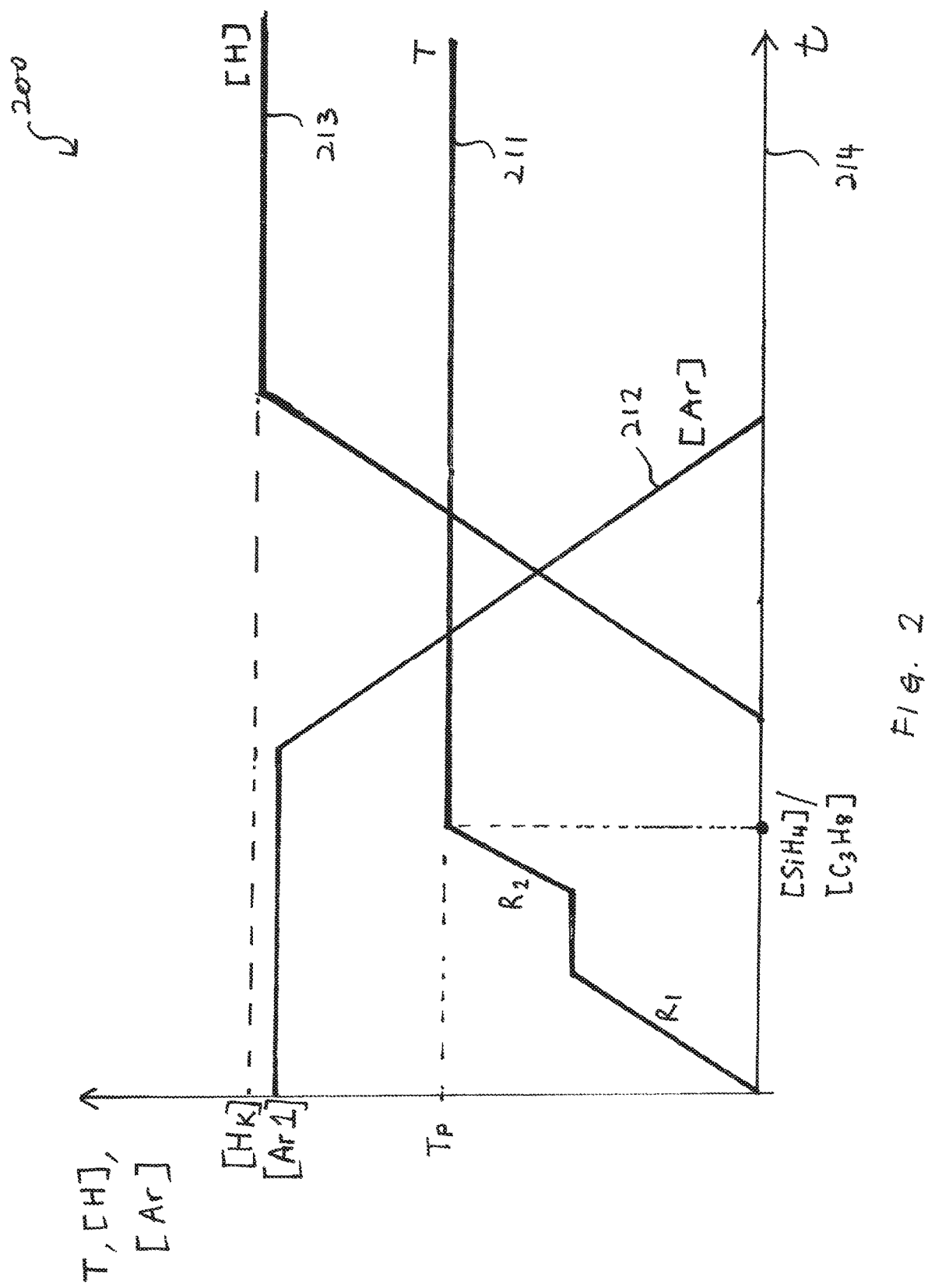
FIG. 2 shows a schematic representation of a method for forming a silicon carbide layer on at least one graphene layer.

FIG. 2 shows a schematic representation 200 of a method for forming a silicon carbide layer on at least one graphene layer according to an embodiment. The method may be similar to the method described in connection with FIGS. 1A and 1B, for example.

The schematic representation 200 shows a variation of a process temperature (T) 211, a concentration of argon gas [Ar] 212, and a concentration of hydrogen gas [H] 213 with respect to time (t) 214.

The method may include heating (or e.g. increasing the temperature of) the semiconductor substrate in an argon atmosphere in a growth system until a predefined temperature Tp (e.g. of at least 600° C.) is reached. The concentration of argon [Ar1] in the growth system during the heat ramping phase may be less than (e.g. at least 1% less than, or e.g. at least 5% less than, or e.g. at least 10% less than) a concentration of hydrogen [Hk] (classic hydrogen concentration) to be used for the growth of the silicon carbide layer at the full growth rate.

The graphene layer may be formed in situ by annealing the SiC substrate under vacuum or inert gas (Ar) prior to SiC growth in the same reactor, for example. An optional hydrogen anneal may be carried out to decoupled the graphene layer from the SiC substrate to improve the electrical and thermal performance of the graphene layer, for example.

The heating of the semiconductor substrate in the argon atmosphere may be carried out by a single stage temperature ramping process or two-stage temperature ramping process (e.g. ramping stage R1 and ramping stage R2), for example. When or after the predefined temperature Tp is reached (or e.g. when or after the semiconductor substrate reaches the predefined temperature Tp, a precursor (e.g. a mixture of silane gas [$SiH_4$] and propane gas [$C_3H_8$]), may be introduced into the growth system, for example. Alternatively, the precursor may be a mixture of silane and methane gas, or e.g. a mixture of Si—H and/or C—H chemical compositions, for example. After the precursor is introduced into the growth system, the concentration of argon gas may be reduced to at least 10% of the original concentration of argon [Ar1], (or e.g. to zero), for example.

The introduction of the precursor (e.g. the mixture of silane gas [$SiH_4$] and propane gas [$C_3H_8$]) at a first (low) concentration into the argon atmosphere may start the growth (or seeding) of the silicon carbide layer at the predefined temperature Tp. The pressure of the growth system may be kept to a minimum so that low supersaturation seeding of the silicon carbide layer may occur. The low pressure of the growth system may also minimize damage to the at least one graphene layer by the process gases, for example.

After seeding of the first portion of the silicon carbide layer or growth of the first portion of the silicon carbide layer on the semiconductor substrate (e.g. on a silicon carbide substrate layer of the semiconductor substrate), the forming of the silicon carbide layer may be continued at a faster (or full) growth rate, for example. For example, hydrogen gas may be introduced into the precursor when or after the concentration of argon gas is reduced. For example, the hydrogen gas may be introduced into the growth system when or after the concentration (or flow) of argon gas is less than 90% (or e.g. less than 80%, or e.g. less than 70%) of the original concentration of argon [Ar1]. The concentration or flow of silane gas [$SiH_4$] and propane gas [$C_3H_8$] may also be increased when or after the hydrogen gas has been introduced, for example. When the concentration of hydrogen [H] reaches the predefined hydrogen concentration [Hk] (classic hydrogen concentration), and when the precursor (e.g. the mixture of silane gas [$SiH_4$] and propane gas [$C_3H_8$]) reaches a predefined concentration, the growth of the silicon carbide layer on the at least one graphene layer occurs at the full growth rate, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIGS. 1A to 1B) or below (e.g. FIGS. 3 to 4).

Figure 3:
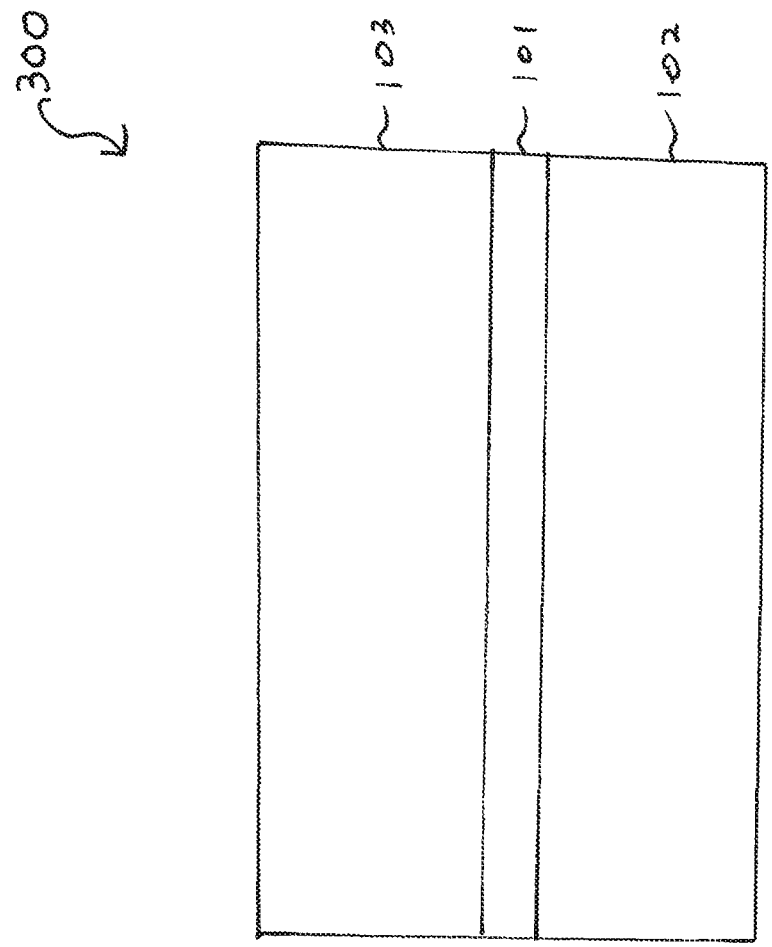
FIG. 3 shows a schematic illustration of a semiconductor device.

FIG. 3 shows a schematic illustration of a semiconductor device 300 according to an embodiment.

The semiconductor device 300 may include at least one graphene layer 101 arranged between a semiconductor substrate 102 and a silicon carbide layer 103.

Due to the at least one graphene layer 101 being arranged between the semiconductor substrate 102 and the silicon carbide layer 103, the at least one graphene layer 101 may improve lateral current conduction or heat spreading from the silicon carbide layer 103 or devices formed in the silicon carbide layer 103 resulting in a suppression of hotspots, for example.

The at least one graphene layer 101 may be a single (e.g. one) graphene layer or may include a plurality of graphene layers, for example. For example, the at least one graphene layer 101 may include a multi-layer graphene structure comprising less than 10 atomic layers of graphene (or e.g. between 1 atomic layer and 10 atomic layers of graphene), for example.

For example, the at least one graphene layer 101 or multi-layer graphene structure may be arranged directly on the surface of the semiconductor substrate 102 (without layer of another material in between). In this example, the at least one graphene layer 101 or multi-layer graphene structure is in contact with the semiconductor substrate 102, for example.

For example, the silicon carbide layer 103 may be located directly on the at least one graphene layer 101 or multi-layer graphene structure (without layer of another material in between). In this example, the silicon carbide layer 103 is in contact with the at least one graphene layer 101 or multi-layer graphene structure, for example.

The at least one graphene layer 101 may include a plurality of openings located in the at least one graphene layer. A maximal lateral dimension of each opening of the plurality of openings in the at least one graphene layer 101 may lie between 10 nm and 10 µm (or e.g. between 1 µm and 10 µm, or e.g. between 2 µm and 8 µm), for example. The maximal lateral dimension of each opening of the plurality of openings may be a largest distance between a first region of the opening and a second region of the opening, for example. Additionally, or optionally, an average of the maximal lateral dimensions of the plurality of openings may lie between 10 nm and 10 µm (or e.g. between 1 µm and 10 µm, or e.g. between 2 µm and 8 µm), for example. The minimal distance between neighboring openings of the plurality of openings may lie between 2 µm and 30 µm (or e.g. between 4 µm and 15 µm), for example. The minimal distance between the neighboring openings may be a smallest distance between the neighboring openings, for example.

The at least one graphene layer 101 may be formed on a silicon atom-terminated surface (e.g. a first side surface) of the at least one silicon carbide substrate layer of the semiconductor substrate 102 or on a carbon atom-terminated surface (an opposite second side surface) of the at least one silicon carbide substrate layer of the semiconductor substrate 102. For example, a single graphene layer 101 may be formed on the silicon atom-terminated surface of the at least one silicon carbide substrate layer of the semiconductor substrate 102. Alternatively, or optionally, a plurality of graphene layers 102 (e.g. one or more graphene layers) may be formed on the carbon atom-terminated surface of the at least one silicon carbide substrate layer of the semiconductor substrate 102, for example.

The at least one graphene layer 101 formed between the silicon carbide layer 103 and the semiconductor substrate 102 may provide a buried electrode for a semiconductor device structure formed (or to be formed) in the silicon carbide layer 103, for example. For example, the at least one graphene layer 101 may be (or may be part of) an electrically conductive and/or thermally conductive contact structure. For example, the at least one graphene layer 101 may provide a back side contact and may exhibit current spreading and/or heat spreading properties as a back side contact.

The semiconductor device structure located in the silicon carbide layer 103 may include electrical circuitry having one or more electrically conductive active elements. The electrically conductive active elements of the semiconductor device structure may be formed at least partially or fully in the silicon carbide layer 103 (e.g. as doping regions with varying or different conductivity types) or may include additional layers incorporated, deposited or grown on the silicon carbide layer 103, for example. For example, an electrically conductive active element may be modified or biased to a different electrical state by an applied external bias (e.g. an applied voltage or applied current signal), for example.

The silicon carbide layer 103 may include at least one doping region of a semiconductor device structure (or a plurality of doping regions). The doping regions of the semiconductor substrate may be active elements of the semiconductor device structure. For example, a doping region of the semiconductor device structure may include or may be a source or emitter region of a transistor structure, a drain or collector region of a transistor structure, a body region of a transistor structure, or a gate region of a transistor structure, for example. For example, the at least one doping region of the semiconductor device structure may include at least part of a (vertical) metal oxide semiconductor field effect transistor (MOSFET) structure, an (vertical) insulated gate bipolar junction transistor (IGBT) structure, a (vertical) thyristor structure or a (vertical) diode structure. For example, the at least one doping region of the semiconductor device structure may be part of a source/drain region of a MOSFET structure, or a collector/emitter region of an IGBT structure, for example. Alternatively, or optionally, the at least one doping region of the semiconductor device structure may be an anode region or cathode region of a diode structure, or an anode region or cathode region of a thyristor structure, for example.

The semiconductor device 300 may be a power semiconductor device comprising a breakdown voltage or blocking voltage of more than more than 10V (e.g. a breakdown voltage of 10 V, 20 V or 50 V), more than 100 V (e.g. a breakdown voltage of 200 V, 300 V, 400 V or 500 V) or more than 500 V (e.g. a breakdown voltage of 600 V, 700 V, 800 V or 1000 V) or more than 1000 V (e.g. a breakdown voltage of 1200 V, 1500 V, 1700 V or 2000 V), for example.

At least one doping region of the semiconductor device structure may be located adjacently to the at least one graphene layer 101. For example, at least one doping region (of the plurality of doping regions) located in the silicon carbide layer 103 may be in electrical connection and/or in thermal connection with the at least one graphene layer 101.

Additionally, optionally or alternatively, the at least one graphene layer may be located under field screening layers (e.g. under p regions of MOSFET and/or merged p-i-n Schottky diode MPS). For example, the collector region of the IGBT structure may be a highly doped (e.g. p+) region formed in the semiconductor substrate 102, and the collector region of the IGBT structure may be formed in the silicon carbide layer 103 located on the at least one graphene layer 101, for example. This may lead to better lateral power distribution in the IGBT, for example.

Additionally, optionally or alternatively, the at least one graphene layer 101 may be located in a space charge free region under the source zone of an IGBT structure and/or power MOSFET structure, to minimize the potentially difference underneath the source during shut down, short circuit or cosmic events, and to improve latch-up stability.

The semiconductor device 300 may be formed by forming (or growing) an epitaxial silicon carbide layer on a substrate 102, depositing at least one graphene layer 101 on the substrate and structuring the at least one graphene layer 101, and growing a further epitaxial silicon carbide layer 103 on the at least one graphene layer 101. A doping region (e.g. a p+-type implanted doping region) may be formed in the (further) silicon carbide layer 103, which may be justified or position on the at least one graphene layer 101 (or graphene island), for example. The p+-type doping region may be a collector region of the IGBT structure or a source zone of the IGBT structure or MOSFET structure, for example.

The semiconductor device structure formed in the silicon carbide layer 103 may optionally further include electrical contact structures which may be electrically connected to the doping regions of the semiconductor device structure in the silicon carbide layer 103. For example, the electrical contact structures may provide an electrically connection between the doping regions of the semiconductor device structure of the semiconductor device and an external structure and/or external circuit.

The semiconductor substrate 102 on which the at least one graphene layer 101 is formed may be a silicon-carbide (SiC) based substrate. Optionally, the semiconductor substrate 102 may be a pure SiC-substrate. Optionally or alternatively, the semiconductor substrate 102 may include at least one silicon carbide substrate layer deposited or located on a carrier substrate (e.g. a silicon substrate or a carbon substrate), for example. Optionally or alternatively, the semiconductor substrate 102 may include a poly-SiC substrate, for example. Optionally or alternatively, the semiconductor substrate 102 may include a silicon carbide substrate layer deposited on a carbon carrier substrate, for example.

The semiconductor substrate 102 may include a plurality of electrically conductive structures extending from the surface (e.g. the back side surface) of the semiconductor substrate 102 at which the at least one graphene layer 101 is formed towards an electrically conductive contact layer located at an opposite surface (e.g. the front side surface) of the semiconductor substrate 102. The plurality of electrically conductive structures may be in contact with the at least one graphene layer 101 and the electrically conductive contact layer, for example. For example, the plurality of electrically conductive structures may provide an electrically conductive path (and/or thermally conductive path) between the at least one graphene layer 101 (and/or the silicon carbide layer 103) and the electrically conductive contact layer. The electrically conductive contact layer may be a back side metallization electrode of the semiconductor device 300, for example.

Additionally, optionally or alternatively, a doping concentration of the semiconductor substrate 102 between the at least one graphene layer and the back side surface of the semiconductor substrate 102 may lie between $1\times10^{18}$ doping atoms per $cm^3$ and $1\times10^{20}$ doping atoms per $cm^3$. Optionally, the plurality of electrically conductive structures may be omitted as the high doping concentration of the semiconductor substrate 102 may provide an electrical path between the at least one graphene layer and the electrically conductive contact layer, for example.

The semiconductor substrate 102 may further include metal layers, insulation layers and/or passivation layers formed on the front side surface or back side surface of the semiconductor substrate 102 or on a surface of one of these layers, for example. The front side surface or back side surface of the semiconductor substrate 102 may be a substantially even plane (e.g. neglecting unevenness of the semiconductor structure due to the manufacturing process and trenches). In comparison to a basically vertical edge of the semiconductor substrate 102, the surface or chip front side of the chip may be a basically horizontal surface extending laterally. For example, the lateral dimension (e.g. a diameter) of the surface of the semiconductor substrate 102 may be more than 100 times larger (or more than 1000 times or more than 10000 times) than a vertical dimension of a vertical edge of the semiconductor substrate 102, for example. An average thickness of the semiconductor substrate 102 may be less than 800 μm (or e.g. less than 200 μm or e.g. less than 100 μm), for example. An average lateral dimension (e.g. an average diameter or length) of the surface of the semiconductor substrate 102 may lie between 50 mm and 450 mm, for example.

Additionally, or optionally, at least one metallization layer (or metallization layer stacks) or at least one barrier layer (or barrier layer stacks) may be located on at least one surface of the semiconductor substrate 102. At least one metallization layer (or metallization layer stacks) or at least one barrier layer (or barrier layer stacks) may be located at a back (or second) side surface of the semiconductor substrate 102.

The at least one metallization layer may include layers comprising aluminum (Al), titanium (Ti), copper (Cu), molybdenum (Mo), nickel (Ni) or combinations or alloys of these materials, for example. The at least one barrier layer may include layers comprising titanium-tungsten (TiW), titanium nitride (TiN), tantalum (Ta), nickel silicide (NiSi), Titanium silicide (TiSi), or tantalum nitride (TaN), for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1A to 2) or below (e.g. FIG. 4).

Figure 4B:
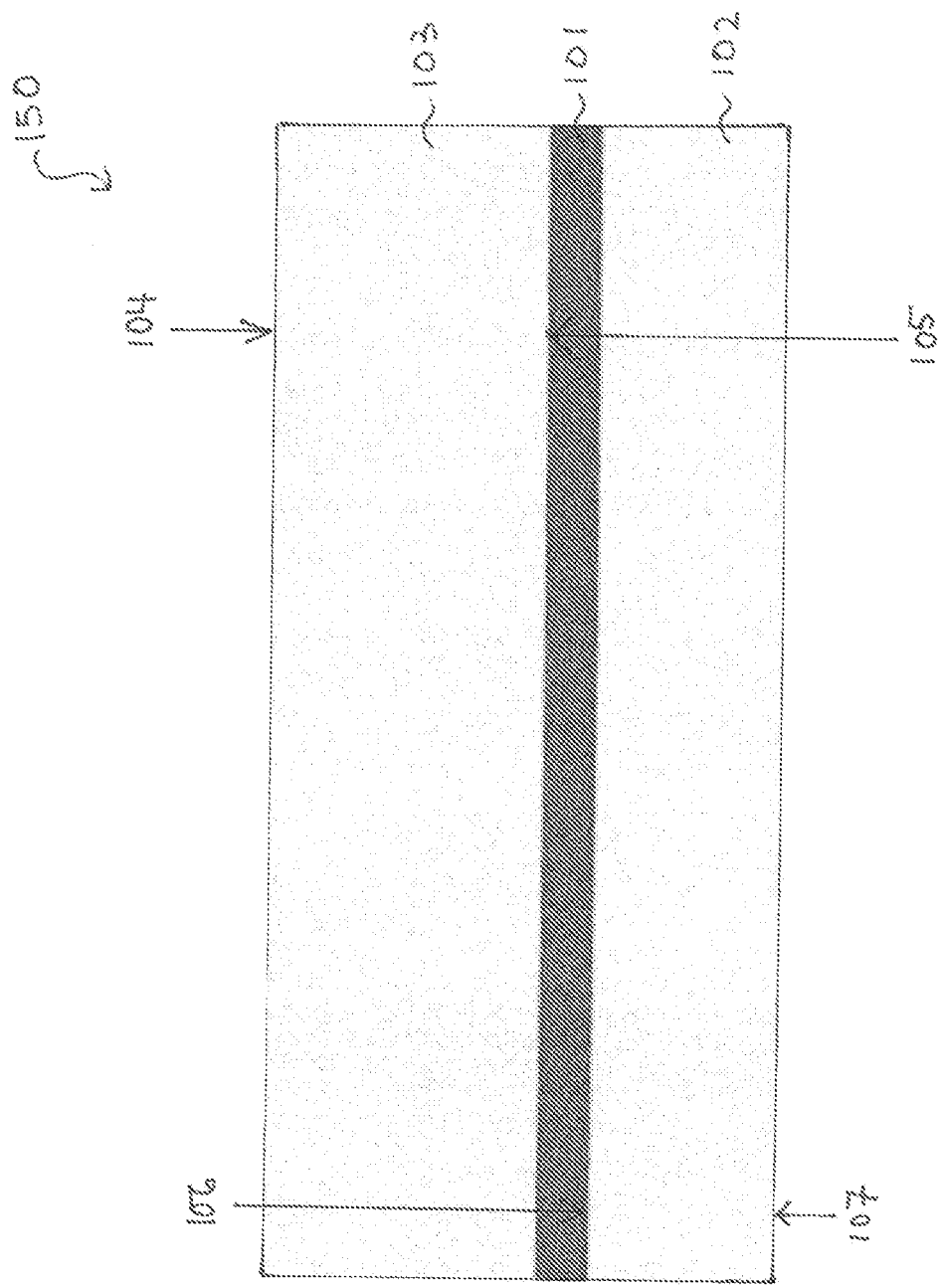
FIG. 4 shows a schematic illustration of a semiconductor device with a back side electrode.

FIG. 4 shows a schematic illustration of a further semiconductor device 400 according to an embodiment.

The semiconductor device 400 may include at least one graphene layer 101 arranged between a substrate 402 and a silicon carbide layer 103. For example, the semiconductor device 400 may include a layer stack including comprising a back side metallization electrically conductive contact layer 421, the substrate 402 (e.g. a silicon carbide based semiconductor substrate), at least one graphene layer 101 and an active SiC element (e.g. a semiconductor device structure).

The semiconductor device 400 may be similar to the semiconductor device described in connection with FIG. 3, for example.

The thickness of the at least one graphene layer 101 may be less than 10 atomic layers (or e.g. between 1 and 10 atomic layers) according to the chosen temperature process. The desired component structures may be realized in the epitaxial silicon carbide layer 103 deposited on the graphene layer 101, for example.

The substrate 402 on which the at least one graphene layer is formed may be a semiconductor substrate as described in connection with FIGS. 1A to 3. Alternatively, or optionally, the substrate 402 may include a carrier substrate (e.g. a silicon substrate or a carbon-based substrate, for example.

The substrate 402 may include a plurality of electrically conductive structures 421 extending from the surface 107 (e.g. the back side surface) of the substrate 402 at which an electrically conductive contact layer 422 is formed towards the graphene layer 101 located at an opposite surface 106 (e.g. the front side surface) of the substrate 402. The plurality of electrically conductive structures 421 may be in contact with the at least one graphene layer 101 and the electrically conductive contact layer 422, for example. For example, the plurality of electrically conductive structures 421 may provide an electrically conductive path (and/or thermally conductive path) between the at least one graphene layer 101 and the electrically conductive contact layer 422. The electrically conductive contact layer 422 may be a back side metallization electrode of the semiconductor device 400, for example. The plurality of electrically conductive structures 421 (e.g. the trenches) may end at (or be directly contacted to) the at least one graphene layer 101 acting as a self-adjusted etch stop, for example. Alternatively, or optionally, the plurality of electrically conductive structures (e.g. the trenches) may end before the at least one graphene layer 101 is reached, for example.

The plurality of electrically conductive structures 421 may include electrically conductive material (e.g. metals, polysilicon, carbon and/or graphene) located in the plurality of trenches. For example, graphene trench layers may be formed on sidewalls of the plurality of trenches. Additionally, or optionally, one or more additional metallization layers or a metallization layer stack may be formed on the graphene trench layers formed on the sidewalls of the plurality of trenches, for example.

Additionally, optionally or alternatively, a doping concentration of the substrate 402 between the at least one graphene layer and the back side surface of the semiconductor substrate 402 (or e.g. between the at least one graphene layer and the electrically conductive contact layer) may lie between $1\times10^{18}$ doping atoms per cm$^3$ and $1\times10^{20}$ doping atoms per cm$^3$. Optionally, the plurality of electrically conductive structures may be omitted as the high doping concentration of the substrate 402 may provide an electrical path between the at least one graphene layer 101 and the back side surface of the semiconductor substrate 402, for example.

Due to the formation of the plurality of electrically conductive structures 421 and/or the high doping concentration of the substrate 402, a thinning of the substrate 402 may be omitted. For example, the thinning of the substrate 402 from the back side towards the graphene layer 101 may be omitted. This may improve the handling of the substrate 102, and may improve the heat capacity (the specific heat capacity multiplied with the thickness or density of the material) of the (silicon carbide) substrate 102. For example, the specific heat capacity may be comparable to that of aluminum (Al), silver (Ag) or gold (Au). Furthermore, wastage due to the thinning of the semiconductor substrate 402 may be reduced or avoided, for example. The thickness of the substrate remaining after thinning may exceed the thickness of the component layers by a factor of more than 10 or even more than 30.

The silicon carbide substrate and the graphene layer may have good thermally conductive properties (e.g. which may be better than Al or Au and comparable to copper). The lateral thermally conductivity may be improved due to heat spreading by the graphene layer 101, and the formation of hot spots (e.g. caused by current surges during power up or shut down processes or short circuiting of the components) may be reduced or avoided, for example.

The plurality of electrically conductive structures 421 may be formed by etching trenches and filling the trenches with electrically conducting material (e.g. metal, doped polysilicon or carbon). The plurality of electrically conductive structures 421 may minimize the path resistance of the substrate 402, for example. Graphene trench layers may be formed on the sidewalls of the trenches to increase the electrical and/or thermal conductivity of the substrate 402.

A maximal lateral dimension of each electrically conductive structure of the plurality of electrically conductive structures may lie between 50 nm and 500 nm (or e.g. between 100 nm and 300 nm), for example. The maximal lateral dimension of the electrically conductive structure may be a largest distance between sidewalls of the electrically conductive structure, in a direction substantially parallel to a lateral surface of the semiconductor substrate 102, for example. A maximal spacing between neighboring electrically conductive structures may lie between 50 nm and 5000 nm (or e.g. between 100 nm and 1000 nm), for example. The maximal spacing between neighboring electrically conductive structures may be a largest distance between sidewalls of neighboring electrically conductive structures, in a direction substantially parallel to a lateral surface of the semiconductor substrate 102, for example.

By controlling a lateral dimension of the plurality of electrically conductive structures and a spacing between the plurality of electrically conductive structures, a doping concentration of the substrate 402 may be reduced without comprising on the path resistance of the substrate 402, for example. For example, with a small separation between the trenches and a minimal lateral expansion of the trenches, a significant increase in the electrical and/or thermal conductivity of the graphene trench layers may lead to an improvement of the substrate properties. For example, the doping of the substrate 402 may be reduced and the thermal conductivity (nevertheless) improved.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1A to 3) or below.

Various examples may relate to methods for cleaving silicon carbide layers, for example. Various examples may relate to methods for forming buried electrodes in silicon carbide materials, for example. Various examples may relate to a separation of thin SiC (from a semiconductor substrate) by depositing a graphene layer on a SiC substrate and subsequently depositing SiC epitaxially on the graphene layer, for example. Various examples may relate to the formation of a graphene layer on a SiC substrate with a subsequent epitaxial SiC deposition on the graphene layer, and the implementation of MOSFETs, IGBTs, thyristors or diodes in the SiC layer, for example. Various examples may relate to a method for forming a graphene layer as a buried electrode.

Aspects and features (e.g. the semiconductor substrate, the at least one graphene layer, the silicon carbide layer, the plurality of openings, the plurality of electrically conductive structures, and the semiconductor device structures) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a silicon carbide semiconductor device, the method comprising:
    forming at least one graphene layer on a surface of a semiconductor substrate; and forming a silicon carbide layer of the silicon carbide semiconductor device on the at least one graphene layer, wherein at least one of forming the silicon carbide layer and forming the at least one graphene layer comprises: heating the semiconductor substrate an inert gas atmosphere until a predefined temperature is reached.

2. The method of claim 1, further comprising:
forming a plurality of openings in the at least one graphene layer before forming the silicon carbide layer, wherein a maximal lateral dimension of each opening of the plurality of openings lies between 10 nm and 10 p.m.

3. The method of claim 1, wherein the inert gas atmosphere is an argon atmosphere.

4. The method of claim 1, wherein forming the silicon carbide layer comprises:
growing a first portion of the silicon carbide layer by atomic layer deposition, molecular beam epitaxy, or by chemical vapor deposition with a precursor at a first concentration; and
continuing the growth of the silicon carbide layer by atomic layer deposition, molecular beam epitaxy, or by chemical vapor deposition with the precursor at a second concentration higher than the first concentration.

5. The method of claim 1, wherein forming the at least one graphene layer comprises:
forming a multi-layer graphene structure comprising less than 10 atomic layers of graphene on the surface of the semiconductor substrate.

6. The method of claim 1, wherein the semiconductor substrate comprises at least one silicon carbide substrate layer, and wherein the at least one graphene layer is formed on the at least one silicon carbide substrate layer of the semiconductor substrate.

7. The method of claim 6, wherein forming the at least one graphene layer comprises:
forming a single graphene layer on a silicon face of the at least one silicon carbide substrate layer; and/or
forming at least one graphene layer on a carbon face of the at least one silicon carbide substrate layer.

8. The method of claim 6, wherein forming the at least one graphene layer comprises:
heating the semiconductor substrate to a temperature of at least 900° C. in an argon atmosphere.

9. The method of claim 1, further comprising:
forming a semiconductor device structure comprising at least one doping region in the silicon carbide layer, the at least one doping region located adjacently to the at least one graphene layer.

10. The method of claim 1, further comprising:
removing the semiconductor substrate from the silicon carbide layer.

11. The method of claim 10, further comprising:
forming a stress-inducing layer on the silicon carbide layer or providing a stress-inducing heating or cooling process for inducing stress between the silicon carbide layer and the semiconductor substrate for removing the semiconductor substrate from the silicon carbide layer.

12. The method of claim 10, further comprising:
arranging the silicon carbide layer on a carrier substrate before or after removing the semiconductor substrate from the silicon carbide layer.

13. The method of claim 10, further comprising:
removing at least one graphene layer remaining on the silicon carbide layer.

14. A method for forming a silicon carbide semiconductor device, the method comprising:
forming at least one graphene layer on a surface of a semiconductor substrate;
forming a plurality of trenches in the semiconductor substrate; and
forming a silicon carbide layer of the silicon carbide semiconductor device on the at least one graphene layer.

15. The method of claim 14, wherein the plurality of trenches is formed by etching and the graphene layer acts as a self-adjusted etch stop of the etching.

16. A silicon carbide semiconductor device, comprising:
at least one graphene layer arranged between a semiconductor substrate and a silicon carbide layer, wherein the silicon carbide layer comprises at least one doping region of a device structure of the silicon carbide semiconductor device.

17. The silicon carbide semiconductor device of claim 16, wherein a doping concentration of the semiconductor substrate between the at least one graphene layer and a back side surface of the semiconductor substrate is in a range between $1\times10^{18}$ doping atoms per $cm^3$ and $1\times10^{20}$ doping atoms per $cm^3$.

18. The silicon carbide semiconductor device of claim 16, wherein the silicon carbide layer comprises at least one doping region of a semiconductor device structure, and wherein the at least one doping region is located adjacently to the at least one graphene layer.

19. The silicon carbide semiconductor device of claim 18, wherein the at least one doping region of the semiconductor device structure is a source/drain region of a metal oxide semiconductor field effect transistor structure, a collector/emitter region of an insulated gate bipolar junction transistor structure, an anode region or cathode region of a thyristor structure, or an anode region or cathode region of a diode structure.

20. The silicon carbide semiconductor device of claim 16, wherein the semiconductor substrate comprises a plurality of electrically conductive structures extending from an electrically conductive contact layer located at a back side surface of the semiconductor substrate towards a surface of the semiconductor substrate at which the at least one graphene layer is formed.

* * * * *

UNITED STATES PATENT AND TRADEMARK OFFICE
CERTIFICATE OF CORRECTION

PATENT NO. : 10,672,875 B2
APPLICATION NO. : 16/224225
DATED : June 2, 2020
INVENTOR(S) : R. Rupp et al.

Page 1 of 1

It is certified that error appears in the above-identified patent and that said Letters Patent is hereby corrected as shown below:

On the Title Page

Item [57], Line 7, change "substrate an" to -- substrate in an --.

In the Claims

Column 19, Line 6 (Claim 1), change "substrate an" to -- substrate in an --.

Column 19, Line 13 (Claim 2), please change "p.m." to -- μm. --.

Signed and Sealed this
Fourth Day of August, 2020

Andrei Iancu
*Director of the United States Patent and Trademark Office*